United States Patent [19]

Parker et al.

[11] Patent Number: 4,473,422

[45] Date of Patent: * Sep. 25, 1984

[54] METALIZED PAPER OR BOARD PRODUCT AND METHOD OF PREPARATION

[75] Inventors: Harry A. Parker, Murray Hill; Joseph Greenman, Plainfield, both of N.J.

[73] Assignee: Transfer Print Foils, Inc., East Brunswick, N.J.

[ * ] Notice: The portion of the term of this patent subsequent to Sep. 14, 1999 has been disclaimed.

[21] Appl. No.: 417,259

[22] Filed: Sep. 13, 1982

Related U.S. Application Data

[63] Continuation-in-part of Ser. No. 242,424, Mar. 11, 1981, Pat. No. 4,349,402, which is a continuation-in-part of Ser. No. 119,782, Feb. 8, 1980, abandoned.

[51] Int. Cl.³ ............. B44C 1/14; B32B 33/00; C25D 1/00; C09J 5/04
[52] U.S. Cl. .................. 156/233; 156/90; 156/239; 156/249; 156/315; 156/344; 427/250; 428/425.8; 428/914
[58] Field of Search ............ 156/230, 233, 231, 239, 156/90, 151, 249, 278, 344, 307.7, 327, 315; 428/425.8, 457, 914, 424.2, 424.4; 427/147, 250, 404; 229/3.5 MF; 426/126

[56] References Cited

U.S. PATENT DOCUMENTS

| | | | |
|---|---|---|---|
| 2,703,772 | 3/1955 | Keithly | 156/239 |
| 3,043,728 | 7/1962 | Stauffer | 156/231 |
| 3,080,270 | 3/1963 | Lorenz | 156/239 |
| 3,235,395 | 2/1966 | Scharf | 156/233 |
| 3,308,004 | 3/1967 | Rouault . | |
| 3,589,962 | 6/1971 | Bonjour | 156/247 |
| 3,620,872 | 11/1971 | Backwell | 156/231 |
| 3,677,792 | 7/1972 | Best | 427/404 |
| 3,730,752 | 5/1973 | Garza et al. | 428/457 |
| 4,012,552 | 3/1977 | Watts | 156/233 |
| 4,153,494 | 5/1979 | Oliva | 156/230 |
| 4,250,209 | 2/1981 | deLeeuw et al. | 156/233 |
| 4,382,831 | 5/1983 | Clough et al. | 156/233 |

FOREIGN PATENT DOCUMENTS 7536682 8/1976 France ................. 156/241

Primary Examiner—Edward C. Kimlin
Assistant Examiner—Louis Falasco
Attorney, Agent, or Firm—David A. Jackson; Daniel H. Bobis

[57] ABSTRACT

A method for producing a metalized paper or board product having a bright surface and improved scratch resistance, comprises a transfer metalization technique utilizing a tie coat applied to the metal layer and a pressure-sensitive, adhesive coat applied to the tie coat, the adhesive coat binding the metalized composite to the paper or board base. The adhesive coat is applied to the paper or board base in the dry state and in combination with the adjacent tie coat, forms a hard, stable bond with the base that favorably withstands subsequent deformation of the paper or board product. A top coat utilizing a particular solvent mixture, offers consistent wettability of adhesive release coats, and provides a smooth, continuous outer surface for the final product.

15 Claims, 2 Drawing Figures

METALIZED PAPER OR BOARD PRODUCT AND METHOD OF PREPARATION

CROSS REFERENCE TO RELATED APPLICATIONS

The present application is a Continuation-In-Part of copending Ser. No. 242,424, filed Mar. 11, 1981 now U.S. Pat. No. 4,349,402, which is in turn, a Continuation-In-Part of Ser. No. 119,782 filed Feb. 8, 1980, now abandoned, all by Harry A. Parker, individually.

FIELD OF THE INVENTION

The present invention relates generally to the production of metalized paper or board products, and particularly to a metalized paper or board product having improved brilliance, and the transfer technique for its preparation.

DESCRIPTION OF THE PRIOR ART

In general, the use of transfer techniques to apply metallic coatings to substrates, such as fabric, leather or plastic surfaces, is well known. Thus, the technique of gold leaf transfer was utilized in the 19th century by bookbinders, who employed gold foil transfer sheets to attach gold letters to leather bindings. The transfer sheets comprised a waxed carrier web over which a sheet of gold foil was placed, the gold foil coated on its free side with a heat-activated adhesive layer. In practice, the transfer sheet was hot pressed with a heated die to adhere the metal foil to the leather, and the carrier was thereafter stripped away. The waxy parting layer that was coated initially over the carrier, served to maintain the gold leaf in position on the carrier prior to its transfer, and to permit release of the carrier after the gold had been affixed to the leather.

In recent times, the advent of vapor deposition of metals, such as aluminum and the like, has spurred further interest in the use of this metalization technique for the preparation of a variety of metalized substrates. Thus, techniques of both direct and transfer coating have been attempted on a variety of base materials, including porous materials such as cloth, leather, paper and the like. The potential usefulness for these metalized substrates is enormous, as, for example, metalized paper or board is broadly used for decorative packaging, and other applications where the appearance of a metal surface is desired.

A number of techniques for the metalization of paper and board are known and are disclosed in the art. Thus, U.S. Pat. No. 3,043,728, to Stauffer, discloses a specific apparatus and associated method for preparing a metalized paper product, which relies on the initial application of the metalized layer to a drum and the transfer of the metal layer to the paper substrate which has been previously directly coated with an adhesive. U.S. Pat. No. 3,235,395, to Scharf, discloses a transfer metalization technique that patentee states is applicable to paper. A heat or pressure sensitive adhesive is utilized in this method.

Other transfer metalization techniques are disclosed in U.S. Pat. Nos. 2,703,772, to Keithly, 3,080,270, to Lorenz, and U.S. Pat. No. 3,589,962, to Bonjour. All of these techniques, however, relate primarily to metalization of fabrics, and make secondary reference to metalization of paper, and in the instance of Lorenz, suggests that an initial coating must be placed on the substrate prior to the transfer of the metal layer thereto.

Direct metalization techniques for the preparation of coated paper products are disclosed in U.S. Pat. No. 3,463,659, to Dragoon et al., and U.S. Pat. No. 3,730,752, to Guajardo Garza et al. In both instances, however, the patentees suggest that a preliminary coating or base coating of the paper substrate is necessary to facilitate application of the metal layer. Finally, U.S. Pat. No. 4,153,494, to Oliva, discloses a metalization technique which when carefully reviewed, appears closer to the ancient art of gold leaf transfer. In particular, Oliva utilizes a varnish, interposed between the metal layer and the substrate to be coated, such as paper or board, so that the metal layer will be adhesively bound thereto. Oliva may apply the varnish either directly to the substrate to be coated, or to the metal layer which is subsequently transferred to the substrate.

Oliva, as well as the remainder of the prior art techniques discussed above, possess certain basic drawbacks, which most of the patentees above already acknowledge. In particular, paper and board substrates are porous materials having residual moisture. The process of applying the metalized surface directly to the paper or board base is complicated by the tendency of the base to exhibit outgassing during the application of the metal coating, that causes coating discontinuities that result in the formation of a dull or matte finish to the metal surface.

Alternately, when the metal layer is formed on a carrier and a transfer to the paper or board base is attempted, the conditions under which such transfer is usually conducted, i.e. pressure and/or elevated temperature, results in the undesirable elimination of all moisture from the porous paper or board base, with the result that the paper or board base subsequently absorbs moisture from the atmosphere and develops surface discontinuities, known as "curling", "cockling", and "crowning", all of which substantially detract from the smooth metalized appearance desired in the product.

In similar fashion, the direct application of adhesives to the paper or board base, as disclosed in certain of the prior art references, causes the same surface discontinuities to develop and the resulting metalized products exhibit the same deficiencies. Attempts to overcome this problem have centered around efforts to apply primer coatings by techniques that subsequently surface treat the paper or board base in an attempt to assure a smooth, sealed surface for the application of the metal layer. Such processes, however, are uneconomical and frequently unreliable, and have enjoyed limited commercial success, if any.

In the previous applications by Harry A. Parker, individually, a method for producing a metalized paper or board product was developed which utilized a lacquer coating disposed on a carrier film, which serves as the top coat of the resulting product, a metalized layer applied to the free surface of the lacquer top coat, a tie coat applied thereafter to the metalized layer and an adhesive emulsion coat applied subsequently to the tie coat, so that the entire multi-layered article as described could be adhesively united with the paper or board base while the adhesive remained in the wet state, simply by passage of the base and the multi-layered article between the nip of pressure rollers. In effect, then, this process while characterized as a "wet" process, utilized pressure alone to achieve a bond between the paper or board base and the multi-layered metalized surface, and as such comprised the departure from the prior art.

Additional advantages of the above described process, were that the resulting article possessed improved scratch resistance and integrity, due to the employment of the intermediate tie coat between the adhesive and the metalized surface. It was theorized that the tie coat provided the desired hardness for scratch resistance, and established a surface environment receptive to firm bonding between the metal layer and the adhesive, which overcame the prior art difficulties of metalized layer corrosion, adhesive exudation, and cracking and crazing of the final paper or board article, in the instance where embossing or other mechanical postforming operations were performed with the product.

While the aforementioned development represents an improvement in the art and enjoys great commercial success at present, that applicants herein determined that it would be desirable to develop a distinctive paper or board product and related method of manufacture that would achieve the same objectives without reliance upon a "wet" process technique. It is to this objective that the present application is directed.

SUMMARY OF THE INVENTION

In accordance with the present invention, a metalized paper or board product is prepared which exhibits improved surface smoothness and brightness, in combination with similar improvements in hardness and scratch resistance. The product is prepared by a process which comprises providing a carrier film with a release coating, applying a quantity of a top coat material to the release coat to form a continuous, smooth surface the top coat to serve as the outer, protective surface of the metalized paper or board product and at the same time, being capable of adherently bonding to a deposited metal film as well as receiving other display material that may be printed or otherwise coated thereon.

Thereafter, a thin, continuous and adherent metal layer is vapor deposited on the top coat, and a tie coat is applied thereover. The tie coat is preferably selected from various thermoplastic resins, including polyesters, vinyl polymers such as polyvinyl alcohol and polyvinyl acetate, polyurethanes and the like. The tie coat may further contain a suitable catalyst to promote improved hardness.

The next step in the method comprises the application of the pressure sensitive adhesive coat. The adhesive is applied wet and permitted to dry at a temperature that may range from room temperature to on the order of 245° F. The adhesive composition may be selected from rubber based resin materials, including natural and synthetic rubbers, and acrylic polymers and co-polymers.

The use of the tie coat in combination with the subsequently applied adhesive coat facilitates later printing and embossing of the paper or board product without the development of undesirable surface discontinuities such as cracking, adhesive migration and exudation.

The formed multi-layer article and the paper or board base may be united in similar fashion to that disclosed in the above referenced earlier applications by Harry A. Parker, individually, by passage thereof between the nip of pressure rollers. Subsequent to this pressure bonding step, the carrier and the formed product may be separated, leaving a smooth surfaced, continuous paper or board product ready for subsequent commercial applications. Further treatment of the present product is unnecessary, as complete and permanent bonding is effected by means of pressure alone. The carrier may be reused in accordance with known techniques and procedures in the art, so that the present process may be practiced on a continuous, endless carrier belt.

Preferably, the top coat is applied to the release coat in a particular solvent system that facilitates the thorough "wetting out" of the release coat previously applied to the carrier. Thus, in a further aspect of the present invention, a top coat composition is disclosed and comprises a resinous coating material and a solvent mixture, the solvent mixture adapted to thoroughly wet an abhesive release coat previously applied to the carrier. In particular, the solvent mixture comprises a first solvent component and a second solvent component, the first solvent component containing a lower alkanol, an alkyl acetate, an alkyl ketone and an aromatic alcohol, and the second solvent component containing a lower alkyl hydrocarbon, and a lower alkyl acetate. The first solvent component and second solvent component are present in a ratio by volume with respect to each other that ranges from about 2:1 to 1:1. The solvent mixture is present in the top coat in an amount sufficient for the top coat to be capable of application to the release coat by gravure printing techniques. Preferably, the resinous coating material comprises nitrocellulose, and the top coat is prepared to a viscosity ranging from about 17 to about 38 seconds, as measured by a No. 2 Zahn Cup.

While the release coat applied to the carrier may vary, a particular release coat comprises a catalyzed organic solution of a silicone resin, such as dimethyl siloxane.

In a preferred embodiment, the top coat comprises a lacquer coating defined as above, with nitrocellulose in a particular solvent mixture that facilitates the preparation of a continuous film on the abhesive release coat preliminarily applied to the carrier. The metal layer is preferably applied by vapor deposition over the top coat. Likewise, the tie coat includes suitable polyester resins, such as polyethylene terephthalate; vinyl polymers, including polyvinyl acetate, polyvinyl chloride, their homopolymers and copolymers; and polyurethane resins, and particularly those prepared with aliphatic isocyanates.

The tie coat may contain a suitable catalyst to facilitate desired curing, in an amount ranging from about 3% to about 7% based on the solids content of the resin. The suitable catalysts comprise free radical catalysts and other metallic and organo metallic catalysts known in the art.

The adhesives of the present invention comprise a variety of elastomers, including natural and synethic rubbers, and may preferably comprise a material such as polyisobutylene, a copolymer of styrene and butadiene, and other equivalent materials.

Thus, the features of the present method and associated product and materials, are that a uniform outer coating or top coat of the paper or board product can be prepared with commercial consistency, without encountering the surface discontinuities that characterize attempts to apply the top coat or lacquer coating to the abhesive release coat.

Further, the use of the pressure-sensitive elastomeric adhesive coat in conjunction with a tie coat, facilitates pressure bonding of the base to the multi-layered metalized article, with the result that a mechanically and thermally stable composite product is prepared. Thus, the drawbacks associated with the use of pressure-sensitive adhesives, such as cracking, adhesive migration and exudation during subsequent mechanical forming operations such as embossing, or corrosive attack of the metalized layer, are all eliminated. The resulting metalized paper or board product possess sufficient hardness to offer improved brilliance and reflectance, as well as scratch resistance and formability unavailable in the prior art products.

The present process may be practiced at room temperature, as heat is not required to bond the multi-layered metalized article to the paper or board base. The present process is a "dry" process, in contrast to the "wet" process disclosed in the previous applications of Harry A. Parker, and thus offers a desirable alternate technique for the preparation of a paper or board product of comparable high quality.

The final product of the present method is simply obtained by stripping the carrier after application of bonding pressure. Bonding pressure is preferably applied in the same manner set forth with respect to the "wet" process disclosed in the above identified copending applications. Further, while a drying step is included herein, it may be performed at room temperature, and may optionally be conducted at a temperature of up to about 250° F., for a period that may range up to about 1 minute, at approximate maximum. It is therefore clear that the present method is particularly energy efficient, as heat energy input is unnecessary.

The completed metalized product may be further processed, and may be printed, embossed or otherwise fashioned in accordance with the art. The metalized layer remains deep and lustrous, and resists cracking under flexure, as in the instance where a quantity of metalized board is formed into a blank which is later assembled to form a box or other container.

Accordingly, it is a principal object of the present invention to provide a method for the rapid and inexpensive manufacture of a metalized paper or board product.

It is a further object of the present invention to provide a method as aforesaid that results in the preparation of a product having inproved surface smoothness, brilliance and hardness.

It is a yet further object of the present invention to provide a method as aforesaid which utilizes a transfer technique employing a dry adhesive without adversely effecting the coated paper or board base.

It is a still further object of the present invention to provide a method as aforesaid which does not require the employment of a post-treatment to cure the adhesive binding the metalized layer to the base.

Other objects and advantages will become apparent to those skilled in the art from a review of the ensuing description which proceeds with reference to the following illustrative drawings.

DETAILED DESCRIPTION

Figure 1:
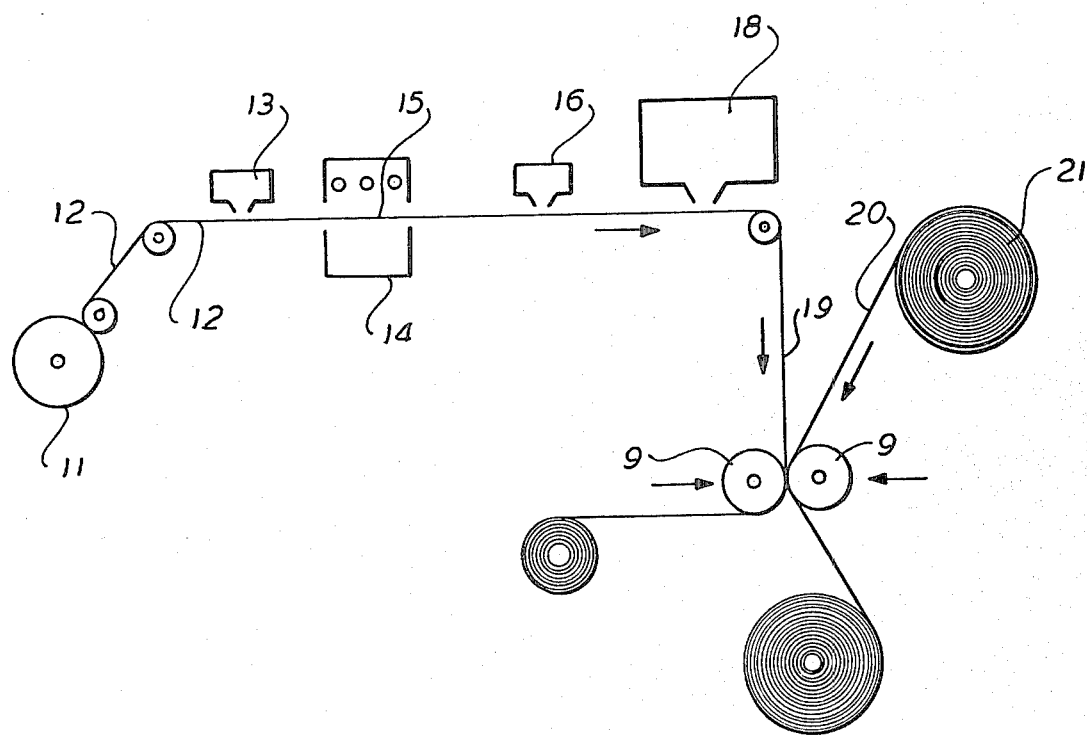
FIG. 1 is a schematic plan view sequentially illustrating the various steps of the present method.
Figure 2:
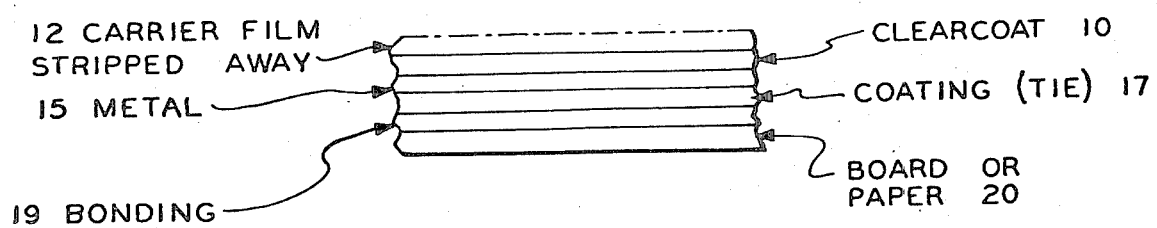
FIG. 2 is a schematic fragmentary sectional view partly in phantom, illustrating the various layers of the metalized paper or board product prepared in accordance with the present invention.

In its broadest aspect, the present invention comprises the preparation of a metalized paper or board product having improved surface smoothness and brightness, and resistance to fracture upon flexure. The method comprises providing and feeding a carrier film applying a top coat to the carrier film, the top coat to serve as the outer, protective surface of the metalized paper or board product. The top coat should preferably be capable of adherently bonding to a deposited metal layer, as well as receiving other display material that may be printed or otherwise coated on its outer surface. Thus, the top coat may be printed or embossed upon, after the paper or board product is complete, or may receive printed indicia, etc. after it dries and prior to its metalization.

The top coat of the invention preferably comprises a lacquer coating defined in greater detail, infra., and may be clear, or colored. In the latter instance, the lacquer coating may contain a pigment or dye and would offer a translucent effect in combination with the underlying metal layer, that confers visual appeal for certain decorative applications.

After application of the top coat, a thin, continuous and adherent metal layer is deposited on the top coat, to provide the brilliant metalized appearance to the resulting paper or board product. A tie coat preferably comprising a polyester or polyurethane composition and optionally containing a suitable catalyst, is thereafter applied to the outer surface of the metal layer, and is permitted to dry. Thereafter, a pressure-sensitive adhesive coat preferably comprising an elastomeric composition, is applied over the tie coat and dried to prepare the composite structure for transfer.

The next step in the method comprises bonding the carrier prepared as described above, and a base such as paper or board by joining the two under pressure. Preferably the carrier and the base are fed into the nip of a pair of pressure rollers, with the surface of the carrier bearing the adhesive coat facing the paper or board base. As the carrier and the base are united between the rollers, the adhesive coat forms a tightly adherent, permanent bond with the base. Subsequently, the carrier may be stripped from the base, leaving the base having adherently bound thereto a multilayered article, comprising the top coat, a next adjacent coating of the metal layer, the tie coat next adjacent to the metal layer and the adhesive bond disposed between the tie coat and the base.

The carriers useful in the present invention includes those materials conventionally employed, that may be capable of withstanding repeated use in accordance with the present method. Thus, the carrier should be capable of successive coating and stripping, and recoating without exhibiting deterioration during metalizing or under the tension of delamination during the release of the transferred composite to the base. Suitable materials employed in accordance with the present invention as the carrier, include polyester films, various cellulose derivatives, vinyl compounds, elastomers and others. Preferably, a polyester film is employed. While the thickness of the carrier is not critical, a thickness of 1 mil is preferred.

Before the top coat is applied to the carrier strip, the carrier strip is desirably coated with a release coat, to assure that a clean separation between the top coat and carrier takes place after the paper or board product is completely formed. Thus, a variety of release coats may be utilized, such as the well known wax coatings and the like. In accordance with the present invention, a particular release coat may be utilized, that comprises a catalyzed silicone resin, known as a "paper release" resin. Preferably, such resins are manufactured by the General Electric Company, and are disposed in a toluene solution. A particular resin comprises dimethyl siloxane. Suitable catalysts for this resin include amino-substituted silanes and organo metallic compounds, such as dibutyltindiacetate. Naturally, the exact composition of the appropriate catalysts for these resins may vary within the skill of the art.

The top coat of the present invention preferably comprises one or more lacquer coatings, which may be selected from a variety of materials capable of providing a durable outer surface for the coated paper or board product. As mentioned earlier, the lacquer coating or top coat is desirably receptive to printed, coated and embossed display material, that may be applied either after the paper or board product is prepared, or during its preparation as mentioned earlier. Likewise, the top coat of lacquer coating must be capable of cleanly stripping away from the carrier, so that a smooth continuous surface is left.

An additional problem, noted earlier, with respect to the application of the lacquer coatings, is that they must be capable of "wetting out" the release coat, as the latter is generally extremely abhesive. A frequent phenomenon encountered when an attempt to apply the lacquer coating to the release coat is made, comprises the globulation of the lacquer coating due to its failure to form a continuous film over the release coat. This phenomenon is known in the art as "crawling" and has comprised one of the major drawbacks to the placement of the top coat on the paper or board product as a preliminary step. Generally, a review of the prior art will disclose that the lacquer coating or top coat is applied subsequent to the application of the metalized layer to the paper or board substrate, as the lacquer coating or top coat is usually suitably adherent to the metal surface.

In accordance with the present invention, a top coat has been developed and is utilized herein, that overcomes the deficiency of "crawling" and successfully forms a continuous, smooth film that forms a hard surface when dry and easily strips away from the adjacent release coat. Thus, the top coat of the present invention comprises a resinous coating material and a solvent mixture, the solvent mixture comprising a first solvent component and a second solvent component, the respective solvent components present with respect to each other in a ratio of about 2:1 to about 1:1, and in amount with respect to the resinous coating material that is sufficient for the top coat to be capable of application to the release coat by gravure printing techniques. More particularly, the top coat as prepared herein may be applied in amounts of from 1 to 2 pounds per ream or approximately 0.1 mil. in thickness. The top coat must be applied in a dilute solution and at low coating rates, and it is these limitations on application of the top coat, that have characteristically encountered the difficulty of "crawling" as mentioned earlier. By contrast, the present top coat is capable of application within these parameters, and forms a smooth, continuous film.

More particularly, the top coat of the present invention comprises a resinous coating material that may be selected from a variety of suitable resins, such as cellulose derivatives, including nitrocellulose and vinyl polymers, such vinyl chloride, vinyl acetate, their homopolymers and copolymers. In particular, a vinyl chloride-vinyl acetate copolymer or nitrocellulose may be utilized.

The solvent mixture may be prepared with the first solvent component containing a lower alkanol, and alkyl acetate, an alkyl ketone and an aromatic alcohol; and the second solvent component containing a lower alkyl hydrocarbon and a lower alkyl acetate. More particularly, the first solvent component contains isopropanol, ethyl acetate, methyl ethyl ketone (MEK), and toluol. The second solvent component comprises heptane and butyl acetate. Preferably, the isopropanol, ethyl acetate and methyl ethyl ketone are each present in an amount ranging from about 15% to about 25% by volume, while the toluol is present in an amount of from about 40% to about 50% by volume. The butyl acetate is present in an amount ranging from about 50% to about 75% by volume with respect to the heptane, with the heptane comprising the remainder.

In a preferred embodiment of the invention, the second solvent component is pre-blended prior to mixture with the first solvent component. The pre-mixture of the butyl acetate and heptane assures a miscibility between the hydrocarbon and the remaining elements of the solvent mixture, that assures a uniform solution having the desirable wetting properties of the present invention. Thus, for example, the first solvent component and the second solvent component may be combined in a volumetric ratio with respect to each other of from 2:1 to about 1:1, and the resinous coating material may thus be present in an amount ranging from about 10% to about 20% by weight, and more particularly from about 12% to about 17% by weight. Naturally, the exact amounts of all components, including the resinous component and the solvents may vary somewhat within the ranges stated above, and such ranges presented herein for purposes of disclosing the best mode of practicing the invention.

The application of the metal layer to the coated carrier may be accomplished by conventional techniques, and is preferably accomplished by vapor deposition. The invention does not relate to the manner in which the metal coating is applied per se, and thus the techniques of vapor deposition of metal as are known in the art, may be utilized herein, and such conventional techniques are incorporated herein by reference. As known in the art, the number of metals that may be applied by this technique to form a tightly adherent, continuous coating is broad, and would include both precious and nonprecious metals, such as gold, silver, tin, zinc, chromium and aluminum. In accordance with the present invention, aluminum is the preferred metal and is applied by vapor deposition to a thickness that may range, for example, up to about 400 Angstroms or greater. The exact thickness of the layer is discretionary, and may vary with the intended application of the paper or board product.

The tie coat as noted earlier, provides improved hardness and scratch resistance to the paper or board product. Suitable tie coat materials include polyesters, such as polyethylene terephthalate; vinyl polymers, such as polyvinyl acetate, polyvinyl alcohol, polyvinyl chloride, their homopolymers and copolymers; and polyurethane compositions. In particular, polyesters and polyurethanes formed with a polyol and an aliphatic isocyanate are preferred. Naturally, polyurethanes produced by the reaction of polyol with an aromatic isocyanate such as toluene di-isocyanate, may be utilized as well, however, polyurethane compositions produced by the reaction of an aliphatic isocyanate with a polyol have been found to result in a tie coat having improved resistance to yellowing or aging.

In a preferred embodiment, the tie coat is catalysed, and contains a catalyst in its composition, in an amount of from about 3% to about 7%, based on resin solids. The presence of the catalyst is believed to enhance hardness of the tie coat. Suitable catalysts include those materials well known for the respective resins, such as benzoyl peroxide, substituted and unsubstituted azobis-butyronitrile and metal catalysts such as sodium, lithium, and organo metallic catalysts (e.g. Ziegler-type catalysts). The foregoing list of catalysts and corresponding resins is representative only and shoud not be viewed as limitative of the present invention.

The polyurethane composition may possess coatings ranging in thickness from about 0.005 thousandths of an inch to about 0.008 thousandths of an inch and particularly from about 0.2 to about 0.7 mil. The polyurethane tie coats are particularly receptive and compatible with the subsequently applied pressure-sensitive adhesive, and thus favorably coact therewith, in addition to imparting improved hardness and scratch resistance to the resulting paper or board product.

The adhesive coating of the present invention is preferably applied as a liquid and as noted earlier, is compatible with the tie coat so that the bond between the metallic layer and the base will be firmly formed. The pressure sensitive adhesive coat is prepared from an elastomer. Suitable elastomers include both natural and synthetic rubber compositions such as polyisobutylene; polyisoprene (natural rubber); a copolymer of 1,3-butadiene and acrylonitrile (Buna N rubber); neoprene (polychloroprene); a copolymer of styrene and butadiene (SBR); a copolymer of isobutylene and isoprene (butyl rubber); and others.

As noted earlier, the adhesive is preferably applied as a liquid but is dried prior to bonding the carrier to the base. The present process is accordingly characterized as a "dry process". By this it is meant that the adhesive is dry when it is applied against the adjacent surface of the paper or board base. The pressure sensitive adhesive may be dried at room temperature by exposure to ambient air, or may conventionally be dried by passage through a coating tunnel generally operating at a temperature on the order of up to 250° F. In the instance where the present method is run at speed from about 200 to about 600 feet per minute, or greater, actual residence time in the drying tunnel may be as little as 10 seconds. This short time, however would be sufficient to dry the pressure sensitive adhesive and to prepare it for the subsequent bonding step.

Bonding the carrier to the paper or board base takes place when the surface bearing the adhesive coat is placed against the base under pressure. A variety of pressure-bonding procedures are contemplated herein, and the invention is not limited to a particular technique. The base and the carrier are preferably united between the nip of the pressure rollers. The ability of the present product to emerge from the pressure rollers in its completed form, without the exhibition of surface defects or dullness is one of the primary features of the present invention.

Referring now to FIG. 1, the production of the paper or board product proceeds in the following manner. A supply roll 11 delivers a sheet, strip or film or a carrier 12 to a series of coaters. The carrier 12 may, as noted earlier, comprise a polyester film. Preferably, the carrier 12 has been previously coated with a release coat, not shown, in accordance with conventional techniques in the art.

A top coat or lacquer coating 10 is then applied by coater 13, and may be applied to the thicknesses suggested earlier herein. Carrier 12 then passes through the vacuum furnace 14 where a vaporized metal layer 15, which may comprise aluminum, is condensed on its upper surface. The exact thickness of layer 15 may vary as indicated earlier.

Carrier 12 now bearing lacquer coating 10 and vaporized metal layer 15 thereover is then fed past a second coater 16 where a tie coat, such as those previously listed, is applied thereover. After the application of the tie coat, the carrier 12 passes to a coater 18 where the pressure sensitive adhesive 19 in liquid form, is applied over the tie coat 17. The adhesive coat is dried as indicated earlier, and carrier 12 is then directed into the nip of opposed rollers 9, 9 simultaneously with the introduction of a sheet or strip of paper or board 20 from a supply roller 21 as illustrated. Thus, carrier 12 and paper or board 20 meet at the nip of rollers 9, 9, and the pressure-sensitive adhesive coat 19 makes bonding contact with the adjacent surface of the paper or board 20. At this point, the bond between the paper or board 20 and the multi-layered composite comprising the lacquer coating 10, the vaporized metal layer 15, the tie coat 17 and the adhesive coat 19 is complete. The carrier 12 may be stripped away from paper or board 20 so that it parts cleanly from lacquer coating 10, and may thereafter be retrieved for reuse in the present method. In such instance, carrier 12 may be a continuous band.

The paper or board product may be used in the form received, as prepared above, and needs no subsequent heat treatment.

The resulting product exhibits improved brilliance and scratch resistance, and is capable of a variety of uses, including imprinting with colored inks, embossing and the like.

Further, though the present invention has been described primarily with respect to the disposition of a metallic coating, it is to be understood that other coatings, such as pearl coatings and paint coatings including irridescent coatings such as "day-glo" may be utilized and the resulting products will possess the same brilliance, smoothness and scratch resistance.

The following examples illustrate the preparation of certain of the coatings useful in the method of the present invention.

EXAMPLE I

A top coat was prepared having the following ingredients in the following amounts.

| INGREDIENTS | PARTS BY WEIGHT |
| --- | --- |
| Nitrocellulose | 20 |
| (½ second viscosity) | |
| (70% wet in alcohol- | |
| Hercules Powder Company | |
| Methyl ethyl ketone | 50 |
| Denatured ethyl alcohol | 30 |
| TOTAL | 100 |

A second formulation was prepared with a vinyl polymer as follows:

| INGREDIENTS | PARTS BY WEIGHT |
|---|---|
| Vinylacetate-vinylcholoride copolymer (VAGH-Union Carbide Corp.) | 15 |
| Methyl ethyl ketone | 50 |
| Toluol | 35 |
| TOTAL | 100 |

EXAMPLE II

A top coat was prepared with the particular solvent mixture of the present invention. Accordingly, a 20% solution of nitrocellulose was formulated that exhibited a viscosity of 25–30 seconds measured with a No. 2 Zahn Cup. The remainder of the solution comprised the first solvent component of the present invention, and contained the following ingredients in the precentages expressed herein by weight, with respect to the solution including the resin.

| INGREDIENTS | AMOUNTS (%) |
|---|---|
| Isopropanol | 13.9 |
| Ethyl Acetate | 16.63 |
| MEK | 13.23 |
| Toluol | 37.14 |

The second solvent component was thereafter prepared, as an equal mixture of butyl acetate and heptane. The second solvent component was then added to the solution containing the first solvent component in the ratio of 20 parts of the first component to 10 parts of the second component.

The resulting nitrocellulose solution was tested and was able to form a continuous film on a carrier coated with a silicone resin release coat, when applied thereto by a gravure printing technique. The viscosity of this solution was determined to be 34 seconds as measured by a No. 2 Zahn Cup.

EXAMPLE III

A tie coat was prepared from polyurethane materials, respectively identified such as Mobay Chemical-Desmocoll E 471, and Desmocol E 477. Preferably, the tie coat is a flexible polyurethane derived from an aliphatic isocyanate and polyol. In the instance where a catalyst or accelerator is desired one may add Mobay-Mondur CD-75, an aromatic polyisocyanate adduct of 12.5 to 13.5% NCO content, and dissolved in ethyl acetate.

EXAMPLE IV

A tie coat was also prepared from a polyester composition manufactured by Goodyear Tire & Rubber Co., identified as "Vitel PE 200", and containing about 6% based on resin solids of the catalyst Mondur CB 75 (Mobay) as identified in Example III, above. Upon application to a vapor deposited aluminum surface, the polyester hardened rapidly and formed a durable crack-resistant layer in the paper product subsequently formed.

This invention may be embodied in other forms or carried out in other ways without departing from the spirit or essential characteristics thereof. The present disclosure is therefore to be considered as in all respect illustrative and not restrictive, the scope of the invention being indicated by the appended claims, and all changes which come within the meaning and range of equivalency are intended to be embraced therein.

What is claimed is:

1. A method for producing a metalized paper or board product having improved surface smoothness and brightness, and resistance to fracture upon flexure, comprising steps of:
    A. providing a carrier film;
    B. applying a top coat to said carrier film, said top coat to serve as an outer, protective surface of said metalized paper or board product and capable of adherently bonding to a deposited metal layer, as well as receiving other display material that may be printed or otherwise coated on the outer surface thereof;
    C. depositing a thin, continuous and adherent metal layer on said top coat;
    D. applying a tie coat to said metal layer;
    E. applying a pressure-sensitive adhesive coat to said tie coat, said adhesive coat prepared from an elastomer to thereby form a fully coated carrier film;
    F. drying said adhesive coat;
    G. bonding the coated carrier film of Step E and a base selected from paper and board, by applying said adhesive coat to said base under pressure; and
    H. separating said carrier from said base to obtain said paper or board product.

2. The method of claim 1 wherein said adhesive coat is dried by heating.

3. The method of claim 2 wherein said pressure-sensitive adhesive coat is heated at a temperature of about 250° F., for up to about one minute.

4. The method of claim 1 wherein said top coat comprises a lacquer coating.

5. The method of claim 4 wherein said lacquer coating is selected from cellulose ethers and esters and vinyl polymers.

6. The method of claim 5 wherein said lacquer coating comprises nitrocellulose.

7. The method of claim 1 wherein said top coat comprises:
    A. a resinous coating material selected from vinyl polymers and nitrocellulose; and
    B. a solvent mixture, said solvent mixture comprising,
        i. a first solvent component containing a lower alkanol, an alkyl acetate, an alkyl ketone and an aromatic alcohol, and
        ii. a second solvent component containing a lower alkyl hydrocarbon and a lower alkyl acetate;
wherein said first solvent component and said second solvent component are present in a ratio with respect to each other of from about 2:1 to 1:1, and wherein said top coat is capable of application to said carrier by gravure printing techniques.

8. The method of claim 7 wherein said resinous coating material comprises nitrocellulose.

9. The method of claim 1 wherein said top coat is colored.

10. The method of claim 1 wherein said metal layer is applied to said top coat by vacuum deposition.

11. The method of claim 1 wherein said tie coat is selected from polyester resins, vinyl polymers and polyurethane resins.

12. The method of claim 11 wherein said tie coat comprises a polyurethane resin prepared with an aliphatic isocyanate.

13. The method either of claim 11 or 12, wherein said tie coat includes a suitable catalyst in an amount of from 3% to 7% based on resin solids.

14. The method of claim 1 wherein said pressure-sensitive adhesive coat comprises a material selected from polyisobutylene, polyisoprene, a copolymer of acrylonitrile and butadiene, neoprene, a copolymer of styrene and butadiene, a copolymer of isobutylene and isoprene, and suitable mixtures thereof.

15. The method of claim 14 wherein said pressure sensitive adhesive comprises polyisobutylene.

* * * * *

UNITED STATES PATENT AND TRADEMARK OFFICE
CERTIFICATE OF CORRECTION

PATENT NO. : 4,473,422
DATED : September 25, 1984
INVENTOR(S) : Harry A. Parker

It is certified that error appears in the above-identified patent and that said Letters Patent are hereby corrected as shown below:

On Page 1 of the Patent under Item [75], please delete "; Joseph Greenman, Plainfield, both of" and insert --,--.

Signed and Sealed this

Thirty-first Day of December 1985

[SEAL]

Attest:

DONALD J. QUIGG

Attesting Officer

Commissioner of Patents and Trademarks